(12) United States Patent
Crandall

(10) Patent No.: US 6,433,707 B1
(45) Date of Patent: Aug. 13, 2002

(54) UNIVERSAL LOSSLESS COMPRESSOR FOR DIGITIZED ANALOG DATA

(75) Inventor: Richard E. Crandall, Portland, OR (US)

(73) Assignee: Pixar Animation Studios, Emeryville, CA (US)

( * ) Notice: Subject to any disclaimer, the term of this patent is extended or adjusted under 35 U.S.C. 154(b) by 0 days.

(21) Appl. No.: 09/454,812

(22) Filed: Dec. 3, 1999

(51) Int. Cl.$^7$ .............................. H03M 7/00; G06K 9/00
(52) U.S. Cl. ............................. 341/50; 341/51; 382/166
(58) Field of Search ............................. 341/50, 51, 65, 341/67; 382/166; 358/427

(56) References Cited

U.S. PATENT DOCUMENTS

| | | | | |
|---|---|---|---|---|
| 5,359,676 A | * | 10/1994 | Fan | 382/56 |
| 5,369,443 A | * | 11/1994 | Woodham | 348/578 |
| 5,764,374 A | * | 6/1998 | Seroussi et al. | 358/427 |
| 6,125,201 A1 | * | 9/2001 | Zador | 382/166 |

\* cited by examiner

Primary Examiner—Peguy Jeanpierre
Assistant Examiner—Jean Bruner Jeanglaude
(74) Attorney, Agent, or Firm—Arent Fox Kintner Plotkin & Kahn, PLLC

(57) ABSTRACT

A universal method and system for compression of general, digitized analog data utilizing Laplacian integer input encoding with space maps is disclosed. The method and system combine and reblock data for more efficient encoding without having to calculate or transmit data-specific frequency tables.

8 Claims, 7 Drawing Sheets

Samples of sound, image, video etc.;
$S$ = samples per datum,
$D$ = spatial dimension of $\sigma$
e.g.
$S = 3,4$ and $D=2$ for color image
$S = 2, D=1$ for stereo sound $D$-dimensional, lossless transform with one or more outputs Space-maps, $H: Z^S \to Z$ Universal Laplacian encoders

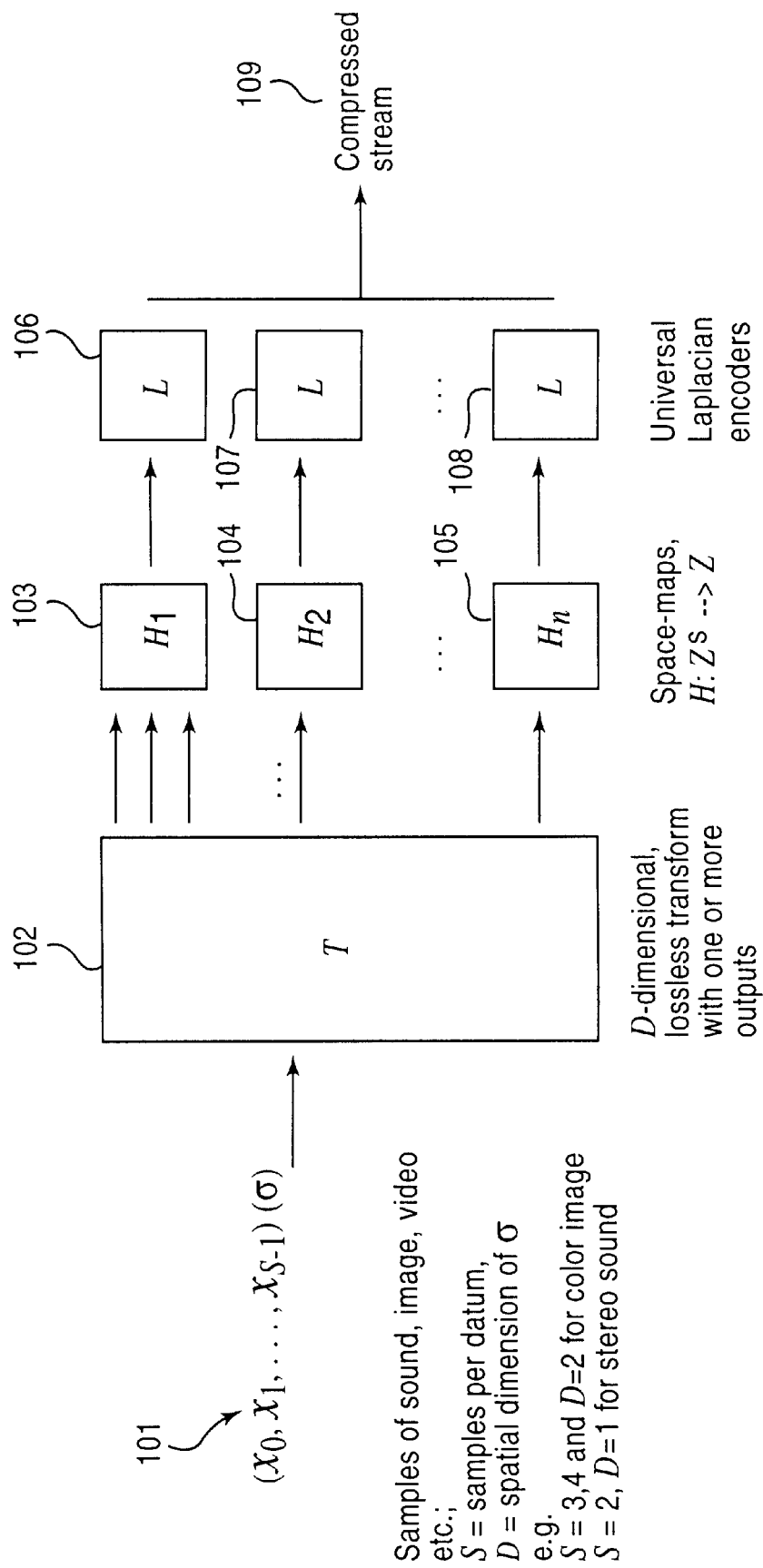

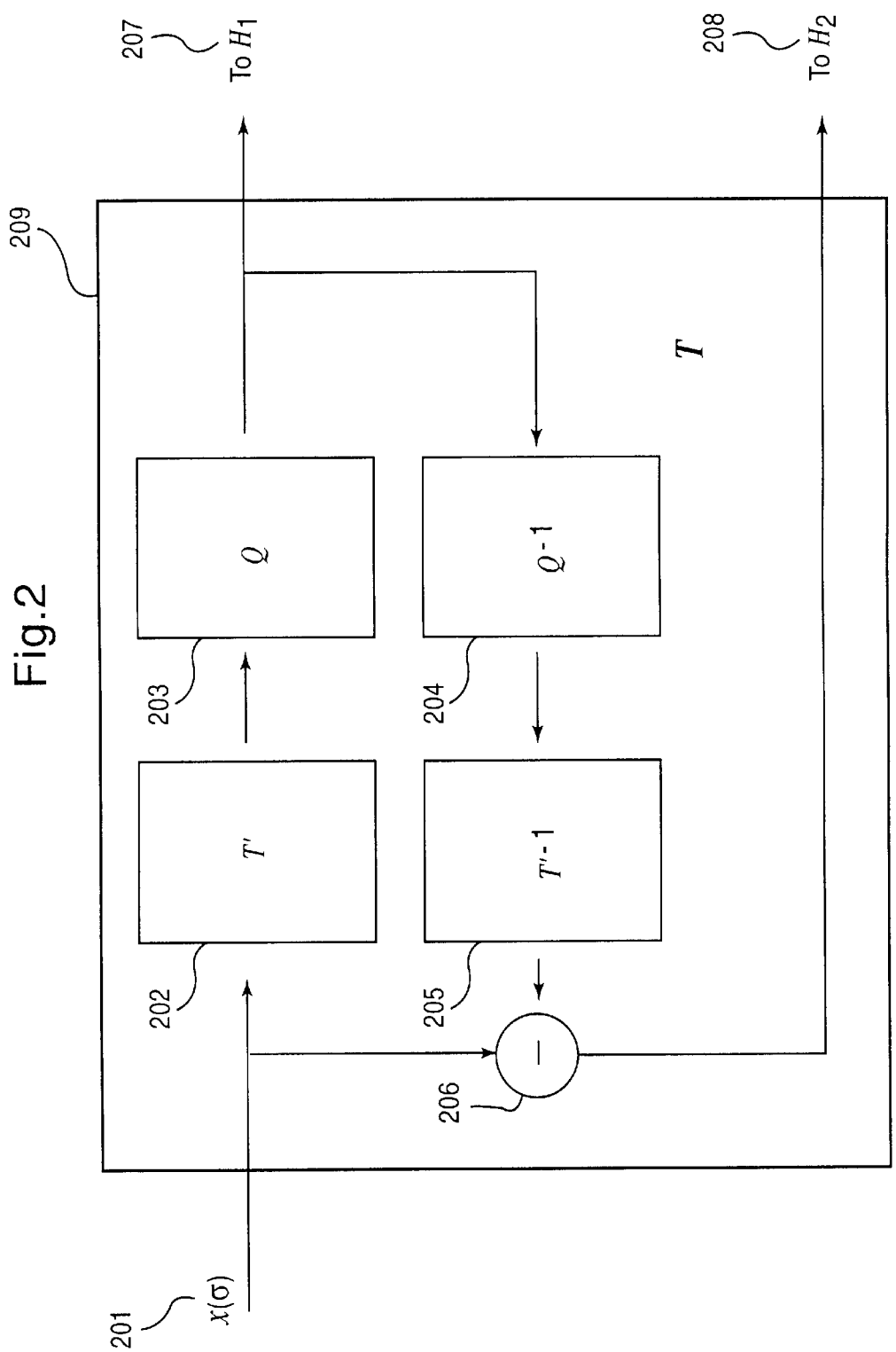

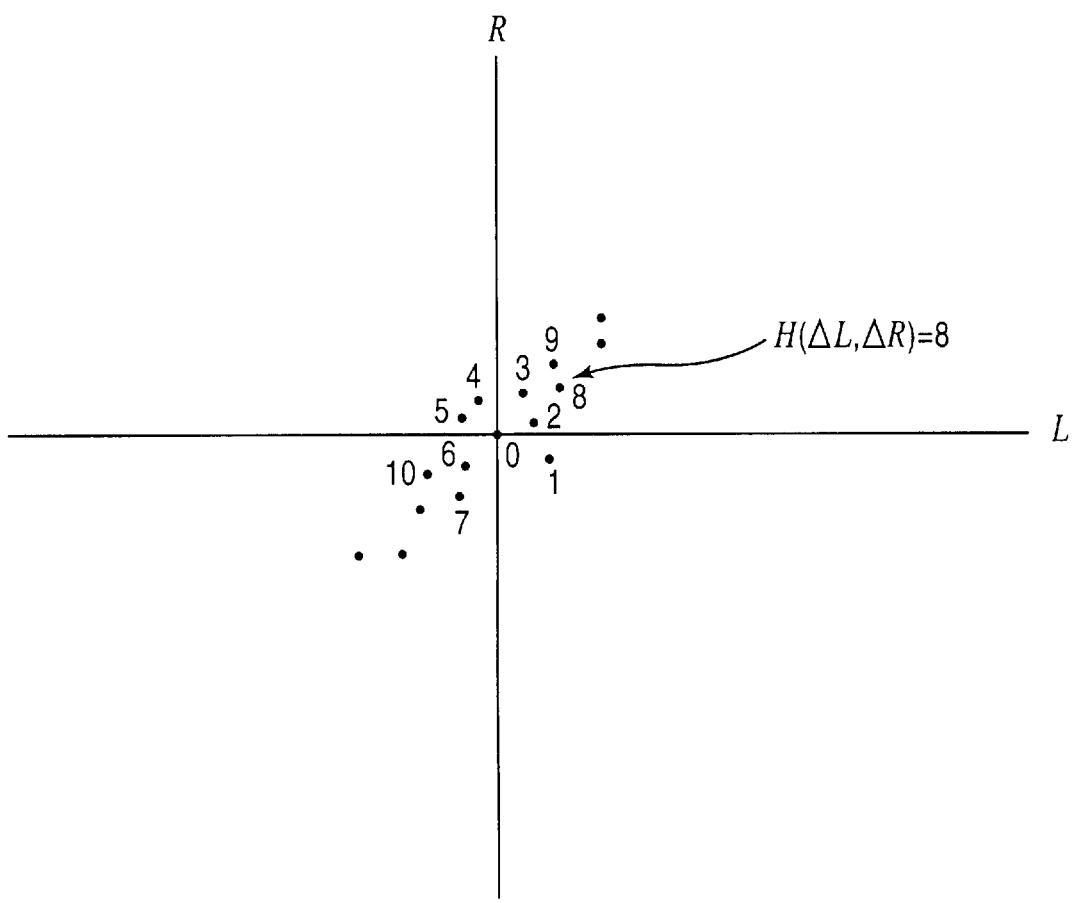

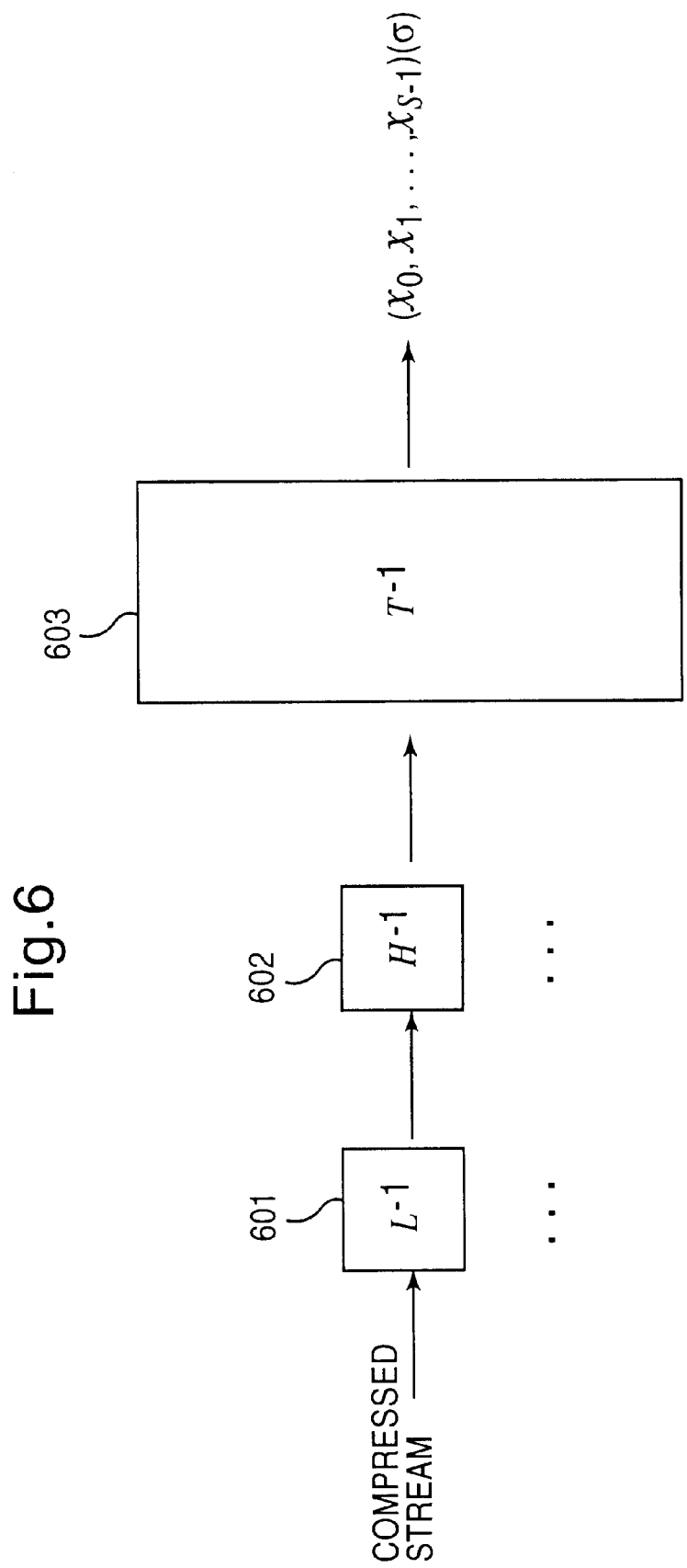

UNIVERSAL LOSSLESS COMPRESSOR FOR DIGITIZED ANALOG DATA

FIELD OF THE INVENTION

The present invention relates to data compression and more particular lossless compression of digitized analog data.

BACKGROUND OF THE INVENTION

Lossless compression methods are required for the efficient transport and storage of high quality digitized images and sound. All existing methods suffer from one or more shortcomings, as is well known in the field, because they are all more or less media specific. Because they were designed to handle text, LZW and similar alphabet based schemes are best suited to data with a small set of primary symbols and frequently repeated combinations. Such methods tend to perform poorly on video and sound Conversely, Adaptive Transform Compression (ATC) works well on sound but performs badly on text.

In addition, many methods including JPEG variants that utilize Huffman or other table-based variable length coding schemes have the drawback that a frequency table for each data set being compressed must be calculated and communicated to the decoder. The calculation of the table increases the time required for encoding, and communication of the table to the decoder takes up valuable bandwidth, reducing the effective compression gain.

Tables can be eliminated if the data is transformed to a form that follows or approximates a Laplacian or other known distribution shape. An example of such a transformation is replacing pixel values with differences of successive pixel values along a scan line. Using the properties of the expected distribution, the encoder can assign efficient (i.e., near entropy) variable bit length codes without constructing a frequency table. In addition, the encoder need transfer to the decoder only the information required to characterize the expected distribution (e.g., the variance of the Laplacian).

Unfortunately, Laplacian encoders are relatively slow particularly when one has to separately encode multiple transformed streams (e.g., three channels of RGB data for color images or two channels for stereo sound). Moreover, the efficiency of standard variable-bit-length encoding depends on the variance of the distribution and the sparseness of the data. Laplacian encoding is inefficient for spiky distributions, i.e., sparse data with large blocks of zeros.

There has thus heretofore been a need for a data compressor that utilizes the advantages of Laplacian encoding, i.e., the elimination of data specific frequency tables, and that performs with speed and efficiency comparable to or better than that of existing table or alphabet based methods.

SUMMARY OF THE INVENTION

The present invention combines a lossless transformation producing approximately Laplacian distributed data with a space map to combine and reblock data streams in order to minimize the number of passes through an efficient Laplacian encoder and to maximize the efficiency of each pass. The present invention is "universal" in that it can compress digitized analog data from any source without calculating or communicating data specific frequency tables.

BRIEF DESCRIPTION OF THE FIGURES

FIG. 1 shows the basic elements of the compressor.

FIG. 2 shows the construction of a lossless transform from lossy transform and accompanying error data.

FIG. 3a shows a two dimensional space map H.

FIG. 6 shows the basic elements of the decompressor.

DETAILED DESCRIPTION OF EXEMPLARY EMBODIMENTS

Figure 3B:
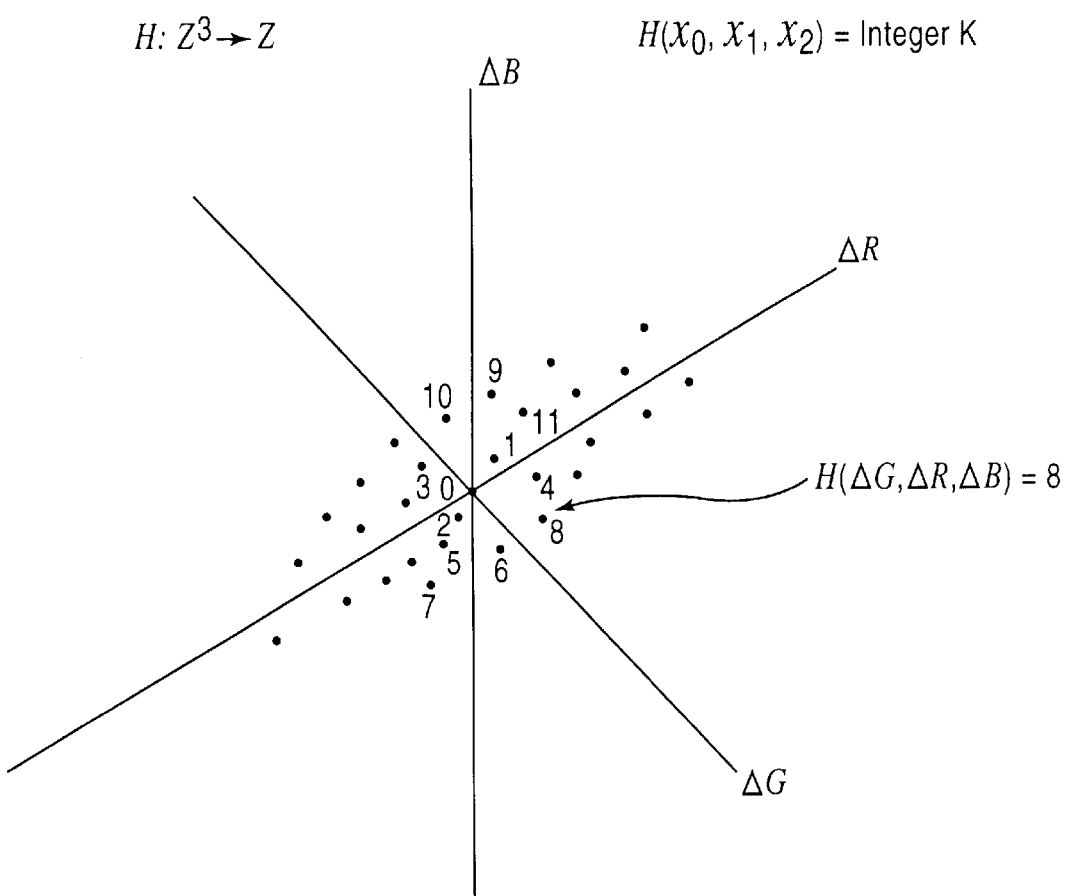
FIG. 3b shows a three dimensional space map H.

FIG. 1 shows the elements of a compressor for digitized analog data consistent with the present invention. 101 is the input uncompressed digitized analog data; $(x_0, x_1, \ldots, x_{S-1})(\sigma)$. The $x_i$ are digitized samples of the S-dimensional analog data taken at discrete points within a D-dimensional space parametrized by $\sigma$. By way of example, for monaural sound data, D=1, $\sigma$ is time and S=1 corresponding to the single channel of monaural sound. Similarly for stereo sound, D is again 1 corresponding to the single time dimension parametrized by $\sigma$, but S=2, corresponding to the two channels of stereo sound. For still color image data, S=3 for the three color channels, e.g., RGB, and D=2 for the two dimensional image coordinates (pixel coordinates). Alternatively one may include as well with RGB an alpha channel characterizing the transparency of the image, in which case S=4. For video compression, σcould include both image and time coordinates for a total D=3. One may, of course, choose alternative parameterizations of the input data. For images, for example, one may take D=1 and compress the data scanline by scanline. Those of ordinary skill in the art will recognize that the present invention is in no way limited to particular data types, dimensions, or parameterizations.

Element 102 is a D-dimensional lossless transform T with one or more outputs. T transforms the input stream of sample data into an equivalent stream (i.e., one from which the original can be losslessly retrieved). Optimally T is chosen so that the data values in its output streams are distributed in a manner that approximates a discretized Laplacian distribution. A Laplacian distribution has a probability density of the form $p(x) = \frac{1}{2\lambda} e^{-|x|/\lambda}$ where $\lambda$ is the mean of the absolute value of x. We define an approximate Laplacian (AL) distribution as any distribution with a probability density with a maximum cusp at the origin and bipolar wings. Finding a transformation T that yields an AL distribution is not difficult to achieve for most data sets of interest (e.g., images and sound). Any number of differencing or "predictor corrector" transformations will yield an AL distribution when applied to actual image or sound data. See, e.g. D. Salomon, *Data Compression, The Complete Reference*, at 203–209 and references cited therein. For D=1 a simple difference operator can be used: $x(n) \to^T \Delta(n) = x(n+1) - x(n)$ or in some cases better results can be achieved with a double difference operator $x(n) \to^T \Delta^2(n) = x(n+1) - 2x(n) + x(n-1)$. More complicated transforms, e.g. wavelets, discrete cosine transforms, etc., may also be used but may not be worth the added complexity for one dimensional data. For D=2, two dimensional wavelet transforms can be used with good effect as can a two-dimensional difference operator of the form $x(m,n) \to {}^T\Delta^{(2)}(m,n)=x(m+1,n)+x(m,n+1)-x(m+1,n+1)-x(m,n)$. This transform has the nice property that it vanishes if the data changes linearly in either direction.

If S is greater than 1, T will generally have multiple outputs. In compressing color image data for example, one may transform the three color channels (RGB or YUV) separately producing three transformed outputs. Similarly for stereo sound the transform T will typically have a separate transformed output for each of the two audio channels. There is, however, no requirement that the number of T outputs be the same as the number of samples per datum of the input data. FIG. 2 shows one situation in which the number of T outputs is twice S. The transform T in FIG. 2 is a lossless transform constructed from a lossy transform QT'. For each input 201, T has two outputs: a lossy compressed stream 207; and a stream of compressed error data ("magic dust") 208 with which one can recover exactly the original input data. In more detail, the transform T is comprised of a lossless transform T', 202 followed by a quantizer (or other lossy step) the composition of which produces a lossy transformed stream QT'. The composition of the inverse quantization step $Q^{-1}$ 204 followed by the inverse lossless transform $T'^{-1}$ 205 acting on the transformed data is subtracted from the original input at the subtractor 206. The resulting quantization error is then the second output 208 which will also follow an AL distribution but with a different variance than stream 207. For a discussion of "magic dust" compressors see R. E. Crandall, *Topics In Advanced Scientific Computation*, at 280–282.

Referring back to FIG. 1, following the transform T are one or more space maps $H_i^k$ 103–105. As shown in FIG. 1, the lower index i runs from 1 to n the number of space maps interposed between the transform T and one or more Laplacian encoders. The index k indicates the dimension of the map. $H_i^k$ is a one-to-one mapping from $Z^k \to Z$, i.e., a mapping from the space of integers in k dimensions to the space of integers (in the following we will suppress one or both of the space map indices when they are unnecessary to the discussion). As shown in FIG. 1 at 103, in some embodiments $H_i^k$ combines and transforms several outputs of T into a one dimensional stream of integer data. In this case k may be the number of transformed inputs combined by the space map $H_i^k$ into a single integer output stream. By combining the outputs of the transform T into a smaller number of integer streams, $H_i^k$ reduces the number of passes required through the Laplacian encoder L (or the number of parallel Laplacian compressors) thus speeding the encoding process. The single space map $H_i^k$ may combine all or only a subset of the outputs from the transform T and, as shown in FIG. 1, different space maps may be used to combine different sets of outputs.

When the transformed outputs combined by a space map are correlated, as would be the case for red, green, blue pixel difference data, combining the three transformed output streams with a space map will increase the compression gain as well as the encoding speed. Because the input streams to the space map are correlated, a space map can be chosen such that the combined output of the space map will have lower entropy than the sum of the entropies of the three inputs and can thus be encoded using fewer bits. The Laplace encoder L is a variable bit rate encoder whose encoding efficiency will approach the entropy limit, if the data sufficiently approximates a theoretical Laplacian whose variance matches that predicted from monitoring the encoder's input stream (see discussion below of Laplacian encoder). The number of bits required to encode an AL steam depends on the number of data points and the variance (width) of the AL distribution.

Without the space map $H_i^k$, k separate data streams each with M elements (where M is the number of data being encoded, e.g., the number of pixels in an image) and with variances $V_1, V_2, \ldots V_k$ must be encoded. The minimum number of bits in the compressed stream is then $M \cdot (E(V_1) + E(V_2) + \ldots E(V_k))$ where E is the average per symbol entropy for an AL distribution of variance V. If the individual streams are correlated, the space map H can be chosen to produce a combined stream also with an AL distribution with M elements and variance a single $V_c$ such that $E(V_c) < 1/k(E(V_1)+E(V_2)+ \ldots E(V_k))$ so that the output of the space map will have lower total entropy than its k input streams and can thus be encoded with fewer bits.

Specifically, in the case of RGB pixel data, one can utilize a space map $H^3: Z^3 \to Z$ to combine the separately transformed RGB pixel data into a single integer data stream. Doing so eliminates two of the three subsequent Laplacian encoding steps. In addition, with a properly chosen H, one can eliminate the normally required step of transforming from RGB to YUV space before encoding, as the basic intent of the YUV transformation is to exploit channel correlation. Therefore, because RGB difference data is typically correlated for any real image, the resulting mapped stream can be encoded with fewer bits than would be required to separately encode the three color streams.

Figure 4A:
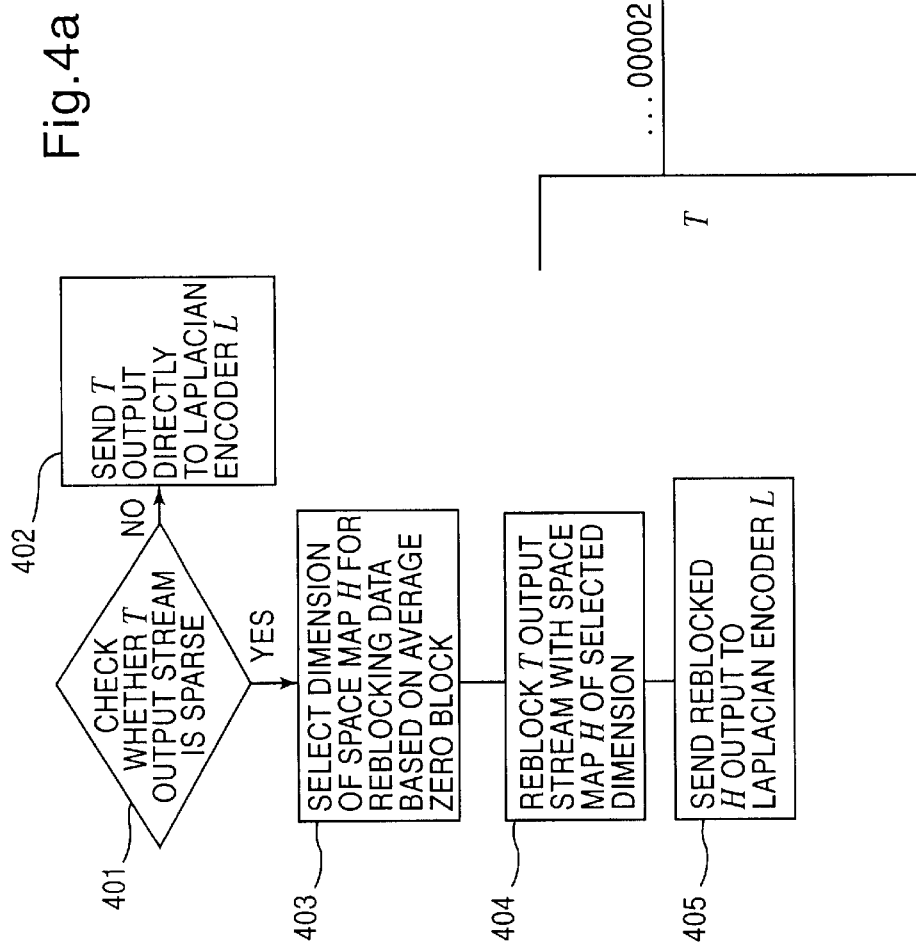
FIG. 4a is a flow chart illustrating the use of H to block data in the transformed stream for more efficient Laplacian compression.
Figure 4B:
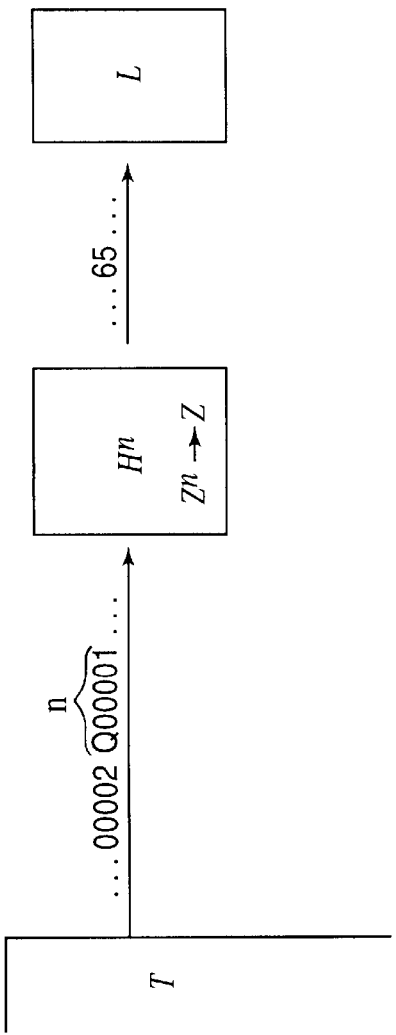
FIG. 4b shows the use of H to block data in the transformed stream for more efficient Laplacian compression.

Standard methods for variable bit length encoding AL data perform poorly on sparse data with large blocks of zeros. This problem can be alleviated by using space maps to reblock the sparse data to a smaller set of integer data with a larger variance before it is encoded. This element of the present invention can be implemented on a single output from the transform T as shown at 105 in FIG. 1 and in more detail in FIG. 4. The steps for doing so are shown in FIG. 4a. In step 401 the output stream from T is checked for sparseness. If it is found to be sparse, a space map $H^n$ is selected at 403 where n is chosen based on the sparseness of the stream, e.g., on the average number of zeros in a block in the output stream from T, as shown in FIG. 4b. If the output from T is not sparse, it is sent directly to the Laplacian encoder at step 402. In step 404, the sparse data stream is reblocked using the space map $H^n$, i.e. n elements in the T output stream are mapped one-to-one to a single integer element in the $H^n$ output. At step 405 the reblocked stream is sent to the Laplacian encoder.

To usefully reblock data or combine transformed streams (whether or not correlated) the space map H should be chosen to preserve the AL nature of the transformed data. That is, the output of the space map H should itself follow an AL distribution but with a variance that will typically differ from the input transformed stream or streams being combined or reblocked. The difference transforms discussed above will typically produce AL distributed output streams centered about the origin. To preserve this property one can choose space maps that take points near the origin in $Z^n$ to points near the origin in Z. As an example, a parameterized curve in 2 dimensions could provide a space map from $Z^2$ to Z provided the parameterization is chosen so that integer coordinates in $R^2$ map to integer parameter values in $R^1$. One possible class of space maps are space filling curves, e.g., Hilbert, Peano, or Sierpinski curves, any of which could be used, if they reduced the total entropy. Examples of two and three-dimensional space maps with the desired locality property are shown in FIG. 3.

The variable bit rate Laplacian encoder L encodes the integer output from H. The encoder L depends on a single parameter λ, a measure of the variance of the AL distribution. λ is the calculated average magnitude of the data to be encoded and can be dynamically adjusted (e.g., recalculated for each scan line or other segment of input data). λ is typically the only information about the encoder that must be transferred to the decoder and can typically be sent in a byte or two.

In encoding a stream of positive and negative integers it is useful to produce three constitutive output streams: $S_1$ identifies the nonzero entries; $S_2$ identifies the sign of the nonzero entries; and $S_3$ contains the magnitude of the nonzero entries. The sum of the entropies of these three streams is equal to the entropy of the original stream, so this decomposition does not degrade the encoding efficiency. The three constituent streams can be encoded separately and transferred serially for a given block of input (e.g. a scan line). $S_1$ is a stream with 0s and 1s for the zero and nonzero elements in the original stream. $S_2$ is the sign stream containing a bit for each nonzero element in $S_1$ that is either 0 or 1 depending on the sign of the corresponding nonzero element in the original stream. $S_3$ includes the magnitude of the nonzero elements of the original stream and can be efficiently encoded using the approximately Laplacian relationship between magnitude and frequency.

Alternatively, one can choose a monopolar space map $H_i^k$ (as shown in FIG. 3) that maps points in $Z^k$ to the non-negative integers directly producing a monopolar AL distribution (i.e., a onesided AL distribution of nonnegative integer data), thus eliminating the need to decompose the space-mapped data stream before encoding.

In either case, the Golomb code provides an efficient method for encoding the resulting monopolar AL stream, whether it be the constituent stream $S_3$ or the direct output of a monopolar space map. See, e.g., D. Salomon, *Data Compression, The Complete Reference*, at 32–33 and references cited therein. The magnitude of the non-negative integer input, a, is coded in two parts using λ the calculated average magnitude of the elements in the integer stream entering the Laplacian encoder. For a non-negative integer α, $\lfloor \alpha/\lambda \rfloor$ is the greatest integer in with a remainder α % λ so that $\alpha = \lfloor \alpha/\lambda \rfloor \lambda + \alpha$ % λ. $\lfloor \alpha/\lambda \rfloor$ is encoded in a unary fashion followed by the remainder, α % λ, encoded in a special binary format. In unary coding a non-negative integer n is represented as n ones followed by a zero. The special binary coding depends on λ. If λ, is a power of 2, i.e., $\lambda = 2^k$, then α % λ is encoded in standard binary fashion in k bits. If λ is not a power of 2, i.e., $\lambda = 2^k + b$, then the smaller remainders: 0, 1, 2 . . . λ−2b−1 are coded in standard k-bit binary. Larger remainders, i e., λ−2b<α % λ<λ, are encoded in k+1 bit binary as α % λ+λ−2b.

For example, if λ=16 and α=94 then $\lfloor \alpha/\lambda \rfloor = 5$ and would be encoded as 111110 and α % λ=14 would be encoded in standard 4-bit binary as 1110 so that the combined code would be 1111101110. For the $\lambda=12=2^3+4$ and α=7, $\lfloor \alpha/\lambda \rfloor = 0$ would be encoded 0 and α % λ=7 would be encoded as α % λ+λ−8=11 in 4 bit binary as 1011 so that the combined code would be 01011.

The Golomb code is but one method for encoding the AL distributed, non-negative, output from the space map H. Those of ordinary skill in the art will recognize that the present invention does not depend on a particular choice of integer encoding scheme and that any method of compressing non-negative integer input data can be substituted for the Golomb scheme described above.

Figure 5A:
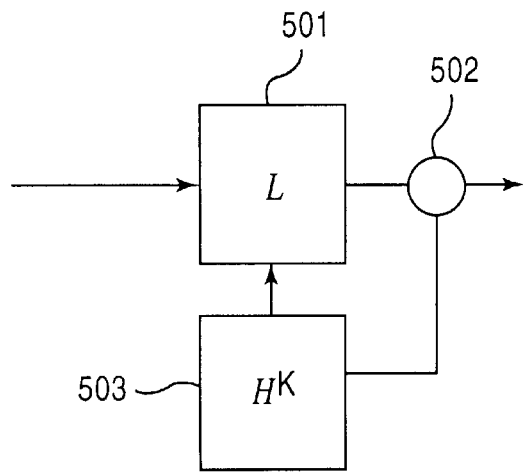
FIG. 5a shows the use of H to recursively re-block the encoded stream.
Figure 5B:
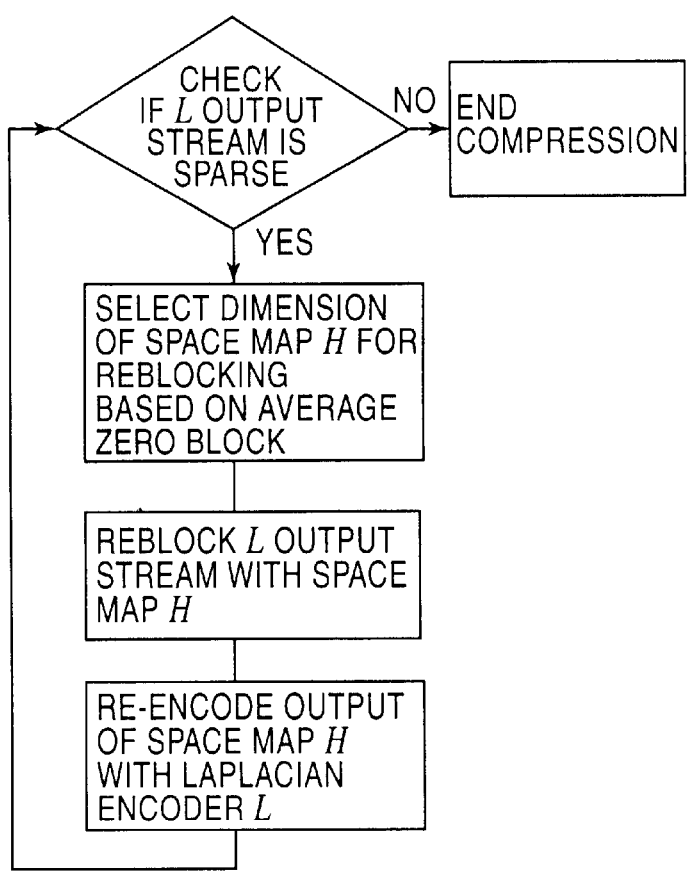
FIG. 5b is a flow chart illustrating the use of H to recursively re-block the encoded stream.

FIG. 5 shows yet another use of a space map H to improve encoding efficiency in an embodiment of the present invention. In this embodiment an additional space map, 503, is included down stream of the Laplace encoder 501. Space map 503 is used to recursively reblock the output of the Laplace encoder 501 if the output is found by the monitor 502 to be too sparse, i.e., contain large blocks of consecutive zeros. If this is the case, the binary data output from 501 is reblocked to a smaller number of integer digits by space map 503. The resulting reblocked stream is then re-encoded by 501 as described above for FIG. 4. One difference in this embodiment is that the that the input to the space map 503 is binary, though the output is a stream of integers. In the embodiments shown in FIGS. 4 and 5, the compressor must produce flag bits that indicate to the decompressor the level at which the data has been reblocked (i.e., the dimension of the space map used) and in the case shown in FIG. 5, the level of recursion at which each reblocking occured.

FIG. 6 shows the basic elements of the decompressor. 601 is the reverse Laplacian encoder and requires from the compressor, only the variance used in the Laplacian encoding step. 602 is the reverse space map and depends only on the dimension of the compression map, which depending on the application and embodiment may be fixed and known or transmitted from the encoder as part of the compressed stream. In any event, the dimension will likely be a single byte or less. The mapping itself can be stored or generated independently in the encoder and decoder and need not be transmitted. If recursive reblocking is used as shown in FIG. 5, then recursive decoding will also require looping through 601 and 602 some number of times that will be signaled by flag bits in the compressed stream. 603 is the inverse transform and requires at most a flag in the incoming stream indicating which of several possible transformations has been used by the encoder.

Because points far from the origin (i.e., in the fringe tail of an AL distribution) require a lot of bits to encode in the Golomb scheme, it may be more efficient in some cases in practice to apply the space map $H^k$ to a k-dimensional core of transformed data and encode exceptions (i.e., transformed data outside the defined k-dimensional core region) separately, e.g., individually. Similarly, Nothing prevents one from changing the dimension k of the space map $H^k$ depending on the nature of the input data. E.g., when stereo correlations are weak one can go from a k=2 dimensional space map (as shown in FIG. 3a) to two k=1 dimensional space maps, encoding each channel separately (a one-dimensional space map can be used both to reblock the one-dimensional data and to convert a bipolor distribution of to a monopolar one as discussed above).

The specific arrangements and methods described herein are merely illustrative of the principles of the present invention. Numerous modifications in form and detail may be made by those of ordinary skill in the art without departing from the scope of the present invention. Although this invention has been shown in relation to particular embodiments, it should not be considered so limited. Rather, the present invention is limited only by the scope of the appended claims.

What is claimed is:

1. A compressor for digitized data, comprising:
   a) a lossless transform block that produces from input digitized data, a plurality of outputs of transformed digitized data;

b) a space map from $Z^n$ to Z that maps a plurality (n) of the outputs of transformed digitized data to a single stream of digitized mapped data;

c) a compressor with integer inputs which compresses said stream of digitized mapped data.

2. The compressor for digitized data of claim 1, wherein said lossless transform block produces digitized data that follows an approximately Laplacian distribution.

3. The compressor for digitized data of claim 1, wherein the output from said lossless transform block comprises a lossy compressed stream and error data.

4. The compressor for digitized data of claim 1, wherein said compressor with integer inputs comprises a double-sided Laplacian compressor.

5. The compressor for digitized data of claim 1, wherein said compressor with integer inputs comprises a Golomb code compressor.

6. The compressor for digitized data of claim 1, wherein said space map maps to non-negative integers.

7. A method for improving the performance of a variable bit length compressor, comprising the steps of:

a) determining the characteristics of integer data to be compressed by a variable bit length compressor;

b) if said characteristics are outside the range for which variable bit length compression is most efficient, parsing said integer data stream into n-tuples;

c) mapping said n-tuples of integers to integers using a space map which takes $Z^n$ to Z, such that the characteristics of the resulting stream allow for more efficient variable bit length encoding.

8. A method for improving the performance of a variable bit length compressor, comprising the steps of:

a) monitoring the characteristics of the output of the variable bit rate compressor;

b) recursively re-blocking the output of said variable bit rate compressor by mapping blocks of n binary digits to the space of integers using a space map which takes $Z^N$ to Z, when said monitoring shows that re-blocking and re-encoding will produce a more efficient compressed stream;

c) re-encoding the re-blocked stream with said variable bit rate compressor.

\* \* \* \* \*